United States Patent
Hosoda et al.

(10) Patent No.: US 8,071,711 B2
(45) Date of Patent: Dec. 6, 2011

(54) POLYESTER FOR PRODUCING FIBER, AND FIBER AND NON-WOVEN FABRIC USING THE SAME

(75) Inventors: Tomoya Hosoda, Tsukuba (JP); Yusaku Kohinata, Tsukuba (JP); Satoshi Okamoto, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 12/461,386

(22) Filed: Aug. 10, 2009

(65) Prior Publication Data
US 2010/0041855 A1    Feb. 18, 2010

(30) Foreign Application Priority Data
Aug. 13, 2008    (JP) ................. 2008-208592

(51) Int. Cl.
*C08G 64/00*    (2006.01)
*C08G 63/02*    (2006.01)

(52) U.S. Cl. ........ 528/272; 428/480; 428/481; 528/190; 528/196; 528/198; 528/271

(58) Field of Classification Search .................. 428/480, 428/481; 528/190, 196, 198, 271, 272
See application file for complete search history.

(56) References Cited

U.S. PATENT DOCUMENTS

| | | |
|---|---|---|
| 4,256,624 A | 3/1981 | Calundann |
| 6,140,455 A * | 10/2000 | Nagashima et al. ........... 528/190 |
| 6,797,345 B2 * | 9/2004 | Okamoto et al. ............. 428/1.6 |
| 7,014,921 B2 * | 3/2006 | Okamoto et al. ............. 428/480 |
| 7,618,552 B2 * | 11/2009 | Hosoda et al. ........... 252/299.01 |
| 2005/0113555 A1 | 5/2005 | Okamoto et al. |
| 2009/0163106 A1 * | 6/2009 | Kohinata et al. ............. 442/414 |
| 2009/0294729 A1 * | 12/2009 | Harada et al. ........... 252/299.01 |

FOREIGN PATENT DOCUMENTS

| | | |
|---|---|---|
| JP | 2002-146003 | 5/2002 |
| JP | 2005-272819 | 10/2005 |

* cited by examiner

*Primary Examiner* — Terressa Boykin
(74) *Attorney, Agent, or Firm* — Foley & Lardner LLP

(57) ABSTRACT

The present invention provides a liquid-crystalline polyester having a structural unit represented by the formula (i), a structural unit represented by the formula (ii) and a structural unit represented by the formula (iii):

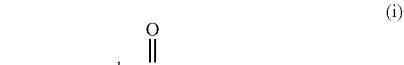

(i)

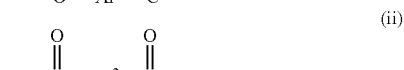

(ii)

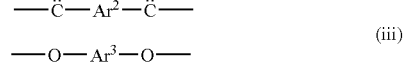

(iii)

wherein $Ar^1$ is, at each occurrence, a member selected from the group consisting of a 2,6-naphthalenediyl group, a 1,4-phenylene group and a 4,4'-biphenylene group; and $Ar^2$ and $Ar^3$ are, at each occurrence, a member selected from the group consisting of a 2,6-naphthalenediyl group, a 1,4-phenylene group, a 1,3-phenylene group and a 4,4'-biphenylene group; wherein 40% by mole or more of all the groups $Ar^1$, $Ar^2$ and $Ar^3$ are 2,6-naphthalenediyl groups; and wherein the polyester has a flow initiation temperature of from about 280 to about 320° C.

4 Claims, No Drawings

POLYESTER FOR PRODUCING FIBER, AND FIBER AND NON-WOVEN FABRIC USING THE SAME

BACKGROUND OF THE INVENTION

1. Field of the Invention

The present invention relates to a material for producing fiber, in particular, a material for producing a liquid crystalline polyester fiber, and a fiber and a non-woven fabric using the same.

2. Description of the Related Art

Liquid crystalline aromatic polyesters are widely used as materials for electronic parts, because of their low hydroscopic property, high heat resistance, excellent property for forming a thin-walled structure, and the like. Aromatic polyester films, for example, are known as a form of the liquid crystalline aromatic polyester suitable for use as electronic parts.

When formed into such a film form, liquid crystalline aromatic polyesters including structural units derived from 2-hydroxy-6-naphthoic acid, structural units derived from phenylene diol, structural units derived from 2,6-naphthalene dicarboxylic acid, and structural units derived from phenylene dicarboxylic acid are disclosed by the present applicants, from which a film having small dielectric loss and high heat resistance can be obtained, are disclosed (see, Japanese Patent Application Laid-Open No. 2005-272819).

SUMMARY OF THE INVENTION

Recently, in order to apply liquid crystalline aromatic polyesters to further various uses utilizing their properties as described above, it has been studied to fiberize the liquid crystalline aromatic polyesters. When the liquid crystalline aromatic polyesters are fiberized, they may be first molten, and then are drawn. At that time, as the molten liquid crystalline aromatic polyester has a low viscosity, the fiberization can be performed better, for example, a thinner fiber can be obtained.

Conventional liquid crystalline aromatic polyesters, however, often increase their viscosity remarkably when they are kept in a molten state for a long time. Hitherto, it has not been necessarily easy to fiberize the liquid crystalline aromatic polyesters from which small dielectric loss and high heat resistance can be obtained.

In view of these circumstances, the present invention has been made. One of objects of the present invention is to provide a liquid crystalline polyester insuring inhibition of the increased viscosity even in a molten state, and being capable of easily fiberizing the liquid crystalline polyester while keeping the good properties as liquid crystalline polyester.

The present invention provides a liquid-crystalline polyester having a structural unit represented by the following formula (i), a structural unit represented by the following formula (ii) and a structural unit represented by the following formula (iii):

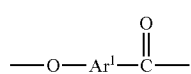  (i)

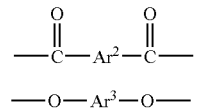  (ii)

  (iii)

wherein $Ar^1$ is, at each occurrence, a member selected from the group consisting of a 2,6-naphthalenediyl group, a 1,4-phenylene group and a 4,4'-biphenylene group; and $Ar^2$ and $Ar^3$ are each independently, at each occurrence, a member selected from the group consisting of a 2,6-naphthalenediyl group, a 1,4-phenylene group, a 1,3-phenylene group and a 4,4'-biphenylene group, provided that one or more hydrogen atoms on the aromatic ring of each of $Ar^1$, $Ar^2$ and $Ar^3$ may be substituted by a halogen atom, an alkyl group having 1 to 10 carbon atoms, or an aryl group having 6 to 20 carbon atoms;

wherein 40% by mole or more of all the groups $Ar^1$, $Ar^2$ and $Ar^3$ are 2,6-naphthalenediyl groups; and wherein the polyester has a flow initiation temperature of from 280 to 320° C.

The liquid-crystalline polyester of the present invention can be used for easily producing a fiber thereof and has structural units (i), (ii) and (iii) in which 40% by mole or more of all the groups represented by $Ar^1$, $Ar^2$ and $Ar^3$ in the structural units are 2,6-naphthalenediyl group, and has a flow initiation temperature of from about 280 to about 320° C. The liquid-crystalline polyester has low dielectric loss, high heat resistance and high heat stability in which the increased viscosity is small even if it is kept molten for a long time. Such a liquid-crystalline polyester, therefore, can be well fiberized while maintaining the excellent properties of the liquid crystalline polyester.

The liquid-crystalline polyester of the present invention preferably has a flow initiation temperature of from about 302 to about 318° C. in view of heat stability.

The present invention also provides fibers obtained using the liquid-crystalline polyester of the invention. Preferably, the fiber is produced from the polyester by a melt-spinning method. The fiber obtained in the invention has a low dielectric loss and high heat resistance, because it is formed from the liquid-crystalline polyester having the properties described above.

Further, the present invention provides non-woven fabrics composed of the above-mentioned fiber. The non-woven fabric of the present invention has a low dielectric loss and heat resistance, which are the properties of the liquid crystalline polyester, and therefore is very useful as substrates for printed wiring boards.

According to the present invention, a liquid-crystalline polyester can suppress viscosity increased even in a molten state, and can be made into fibers while maintaining excellent properties of the liquid crystalline polyester. Using the liquid-crystalline polyester, a fiber and a non-woven fabric with excellent properties can be also obtained in the present invention.

DETAILED DESCRIPTION OF THE PREFERRED EMBODIMENTS

First, a liquid crystalline polyester of the present invention will be described. The liquid crystalline polyester preferably shows optical anisotropy upon melting, and can be formed into an anisotropic melt at a temperature of 450° C. or less. The liquid crystalline polyester has a structural unit represented by the following formula (i), a structural unit represented by the following formula (ii) and a structural unit represented by the following formula (iii):

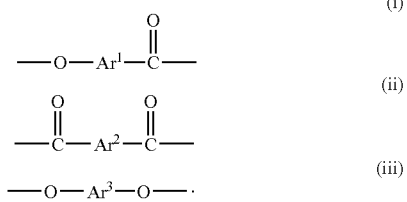

In the formula (i), $Ar^1$ may be, at each occurrence, a member (such as a divalent aromatic group) selected from the group consisting of a 2,6-naphthalenediyl group, a 1,4-phenylene group and a 4,4'-biphenylene group; and $Ar^2$ and $Ar^3$ in the formulas (ii) and (iii) are independently, at each occurrence, a member (such as a divalent aromatic group) selected from the group consisting of a 2,6-naphthalenediyl group, a 1,4-phenylene group, a 1,3-phenylene group and a 4,4'-biphenylene group. One or more hydrogen atoms on the aromatic ring of each of $Ar^1$, $Ar^2$ and $Ar^3$ may be substituted by a halogen atom, an alkyl group having 1 to 10 carbon atoms, or an aryl group having 6 to 20 carbon atoms. The aromatic groups in the group $Ar^1$, $Ar^2$ and $Ar^3$ are each included in the liquid crystalline polyester in plurality of its kinds, and they may be the same or different.

In this embodiment, the liquid crystalline polyester of the present invention includes 2,6-naphthalenediyl groups in the amount of 40% by mole or more of all the groups $Ar^1$, $Ar^2$ and $Ar^3$ in the formulas (i), (ii) and (iii). A ratio (by %) of 2,6-naphthalenediyl groups to all the groups $Ar^1$, $Ar^2$ and $Ar^3$ is, herein, referred to as a "blending ratio of a 2,6-naphthalenediyl group". As far as the liquid crystalline polyester has 2,6-naphthalenediyl groups among all the $Ar^1$, $Ar^2$ and $Ar^3$ in the ratio satisfying the above-mentioned condition, one or two of the groups $Ar^1$, $Ar^2$ and $Ar^3$ may not be 2,6-naphthalenediyl group.

In the liquid crystalline polyester, it is preferable that the blending ratio of a 2,6-naphthalenediyl group is 50% by mole or more, more preferably 65% by mole or more, furthermore preferably 70% by mole or more. The more preferable the blending ratio of a 2,6-naphthalenediyl group, the lower the dielectric dissipation factor in the obtained liquid crystalline polyester. However, in order to obtain sufficient processability upon melting (melt-spinning property), it is also possible that the blending ratio of a 2,6-naphthalenediyl group is preferably 90% by mole or less.

The liquid crystalline polyester preferably has 30 to 80% by mole of the structural units represented by the formula (i) (hereinafter referred to as the "structural unit (i)", 10 to 35% by mole of the structural units represented by the formula (ii) (hereinafter referred to as the "structural unit (ii)", and 10% by mole of the structural units represented by the formula (iii) (hereinafter referred to as the "structural unit (iii)", the amount unit "% by mole" being based on 100% by mole of all the structural units represented by the formulas (i), (ii) and (iii).

The liquid crystalline polyester satisfying the above-mentioned molar ratios (copolymerization ratio) of the structural units has high liquid crystallinity, exhibits excellent properties and can be molten at practical temperatures, and therefore it is particularly advantageous as materials for producing liquid crystalline polyester fibers.

From the viewpoint of the acquisition of heat resistance, the liquid crystalline polyester is preferably a fully aromatic polyester, and accordingly it is preferably composed of the structural units (i), the structural units (ii) and the structural units (iii) alone in all of the repeating units thereof, and does not include repeating units other than these structural units. Also, from the same viewpoint, it is preferable that the molar ratio, based on the total of all of the structural units, of the structural units (ii) is the same as that of the structural units (iii).

The more preferable molar ratios of the structural units are described below. The molar ratio of the structural units (i) is preferably from 40 to 70% by mole, based on 100% by mole of the total of all structural units, more preferably from 45 to 65% by mole. The molar ratios of the structural units (ii) and the structural units (iii) are both preferably from 15 to 30% by mole, more preferably from 17.5 to 27.5% by mole.

When molar ratios of the structural units are within the more preferable range, the liquid crystalline polyester can exhibit higher liquid crystallinity, and excellent properties such as a low dielectric loss and high heat resistance can be obtained, as well as a melting temperature is within a practical range, and therefore it tends to fiberize it more easily.

The structural units (i) in these structural units are derived from an aromatic hydroxycarboxylic acid. The aromatic hydroxycarboxylic acid from which the structural units (i) is derived includes 2-hydroxy-6-naphthoic acid, p-hydroxybenzoic acid, 4-(4-hydroxyphenyl)benzoic acid, and the like. The benzene rings or naphthalene rings in these monomers may be substituted by a halogen atom, an alkyl group having 1 to 10 carbon atoms or an aryl group having 6 to 20 carbon atoms. A 2,6-Naphthalenediyl group is derived from 2-hydroxy-6-naphthoic acid among them.

The structural units (ii) are derived from an aromatic dicarboxylic acid. Examples of the aromatic dicarboxylic acid from which the structural units (ii) are derived includes 2,6-naphthalene dicarboxylic acid, terephthalic acid, isophthalic acid, biphenyl-4,4'-dicarboxylic acid, and the like. The benzene rings or naphthalene rings in these monomers may be substituted by a halogen atom, an alkyl group having 1 to 10 carbon atoms or an aryl group having 6 to 20 carbon atoms. A 2,6-Naphthalenediyl group is derived from 2,6-naphthalene dicarboxylic acid among them.

The structural units (iii) are derived from an aromatic diol. The aromatic diol from which the structural units (iii) are derived includes 2,6-naphthalenediol, hydroquinone, resorcin, 4,4'-dihydroxybiphenyl, and the like. The benzene rings or naphthalene rings in these monomers may be substituted by a halogen atom, an alkyl group having 1 to 10 carbon atoms or an aryl group having 6 to 20 carbon atoms. A 2,6-Naphthalenediyl group is derived from 2,6-naphthalenediol among them.

The aromatic rings in $Ar^1$, $Ar^2$ and $Ar^3$ present in the structural units (i), (ii) and (iii) may be substituted by a halogen atom, an alkyl group having 1 to 10 carbon atoms, or an aryl group having 6 to 20 carbon atoms. These substituents are introduced into the structural units by using monomers having a benzene ring or naphthalene ring with such a substituent as the monomers to be introduced into the structural units.

Examples of the halogen atom as the substituent include a fluorine atom, a chlorine atom, a bromine atom, and an iodine atom. The alkyl group having 1 to 10 carbon atoms includes a methyl group, an ethyl group, a propyl group, a butyl group, a hexyl group, an octyl group, a decyl group, and the like, which may be linear or branched, or an alicyclic group. The aryl group having 6 to 20 carbon atoms includes, for example, a phenyl group, a naphthyl group, and the like.

Known methods for producing a liquid crystalline polyester can be applied to the production of the liquid crystalline polyesters having the structural units (i), (ii) and (iii). For example, the liquid crystalline polyester can be produced by a method in which monomers corresponding to the structural units (i), (ii) and (iii) are mixed in the preferable molar ratios as mentioned above and the resulting mixture is polymerized. In this case, a ratio of monomers corresponding to the structural units having 2,6-naphthalenediyl group to the monomers corresponding to the structural units (i), (ii) and (iii) may be appropriately adjusted so as to obtain the above-mentioned preferable blending ratio of a 2,6-naphthalenediyl group in the liquid crystalline polyester.

Examples of the preferable methods for producing the liquid crystalline polyester include a method in which the monomers from which the structural units (i), (ii) and (iii) are derived are converted to ester-forming derivatives and the derivatives thereof are polymerized. In such a method, the polymerization more easily promoted to provide the liquid crystalline polyester of the present invention. The ester-forming derivative herein refers to a compound including a group capable of promoting an ester-forming reaction. For example, an ester-forming derivative of a monomer having carboxyl group is the monomer wherein the carboxyl group is converted to an acid halide or acid anhydride. An ester-forming derivative of a monomer having hydroxyl group is the monomer wherein the hydroxyl group is esterified by using a lower carboxylic acid.

Examples for producing the liquid crystalline polyester using such an ester-forming derivative include a method of using an ester-forming derivative converted to an ester by reacting the hydroxyl group in the monomer with a lower carboxylic acid. More specifically, the liquid crystalline polyester may be produced by a method using an ester-forming derivative in which hydroxyl groups in an aromatic hydroxycarboxylic acid and an aromatic diol (each of which monomer corresponding to structural units (i) or the structural units (iii)) is converted (i.e., acylated) to acyl groups. Acylation can be performed by reacting hydroxyl groups in monomers with acetic anhydride.

The thus obtained ester-forming derivatives can be subjected to polycondensation with an aromatic dicarboxylic acid, which is a monomer from which the structural units (ii) are derived, by removing acetic acid, and the liquid crystalline polyester can be easily produced.

Examples of the method for producing the liquid crystalline polyester using the ester-forming derivative as described above include a methods described in Japanese Patent Application Laid-Open No. 2002-146003. This method will be specifically described below.

First, an aromatic hydroxycarboxylic acid, an aromatic dicarboxylic acid and an aromatic diol are prepared as monomers from which the structural units (i), (ii) and (iii) are derived, respectively. In order to obtain the above-mentioned blending ratio of a 2,6-naphthalenediyl group, among the above-mentioned monomers, the monomers from which the structural units having 2,6-naphthalenediyl groups are derived are included so as to obtain the above-mentioned blending ratio of a 2,6-naphthalenediyl group.

Then, hydroxyl groups in the aromatic hydroxycarboxylic acid and the aromatic diol are acylated to convert ester-forming derivatives. Then, the ester-forming derivatives derived from the aromatic hydroxycarboxylic acid and the aromatic diol are melt-polymerized with the aromatic dicarboxylic acid to give a liquid crystalline polyester having a smaller molecular weight than the desired one (prepolymer). In the production of the liquid crystalline polyester, it is preferable that the prepolymer has a flow initiation temperature of 200° C. or more and less than 280° C. The molecular weight of the prepolymer is made higher by a solid phase polymerization, as described below, until it get a flow initiation temperature of about 280 to about 320° C., more preferably about 302 to about 318° C.

In order to obtain a liquid crystalline polyester having a preferable flow initiation temperature, a solid phase polymerization is performed using the obtained prepolymer. The solid phase polymerization can be performed by the steps of pulverizing the prepolymer into a powder, and heating the prepolymer powder. The polymerization of the prepolymer of the liquid crystalline polyester proceeds in this manner, and a liquid crystalline polyester having a desired molecular weight can be obtained. By using such a solid phase polymerization, the polymerization of the prepolymer proceeds well to easily give a liquid crystalline polyester having a high molecular weight. In other word, it is easy to control the flow-starting viscosity to get the desired one described below by using the solid phase polymerization.

In order to obtain a prepolymer powder in the solid phase polymerization, the prepolymer obtained by the melt-polymerization may be cooled and solidified, and then the solidified prepolymer may be pulverized by various known pulverization methods. The prepolymer powder obtained in the solid phase polymerization has an average particle size of preferably 0.05 to 3 mm, more preferably from 0.05 to 1 mm. When the particle size of the prepolymer powder is within such a range, the degree of polymerization may be increased. In particular, when the particle size is within a range of 0.05 to 1 mm, it tends to further more promote the molecular weight higher, because sintering is not caused between the particles.

Solid phase polymerization is preferably carried out under the conditions as follows. That is, a temperature rise, in the first step, the temperature is raised from room temperature to a temperature which is 20° C. lower than a flow initiation temperature of a prepolymer. It is preferable that the rate of the temperature rise is set so as to complete the temperature rise within one hour, in order to shorten the reaction time.

In the second step of the temperature rise, the temperature is raised from the temperature when the first step of the temperature rise is finished to a temperature of 260° C. or more. At this time, the rate of the temperature rise is preferably from 0.3° C./minute or less, more preferably from 0.05 to 0.15° C./minute. When the rate of the temperature rise is 0.3° C./minute or less, it is hard to cause sintering between the particles, and therefore it is easy to obtain a liquid crystalline polyester having a higher degree of polymerization.

After the second step of the temperature rise is completed, it is preferable to heat the prepolymer at a temperature of 260° C. or more, more preferably at a temperature range of 260 to 320° C. for 30 minutes or more to further increase the degree of polymerization of the liquid crystalline polyester. In particular, in order to improve the heat-stability by obtaining a liquid crystalline polyester having a preferable flow initiation temperature, described below, it is preferable to perform the heating treatment at 270 to 310° C. for 30 minutes to 30 hours, more preferably at 270 to 305° C. for 30 minutes to 20 hour. The conditions in the case of heating may be suitably set depending on the kind of the monomer used for producing the liquid crystalline polyester, and the like.

The solid phase polymerization conditions may be predetermined by performing a preliminary experiment procedure as described below. That is, experiments may be performed, for example, by altering finally reached temperature in the second step of the temperature rise several times, using about 100 g of a prepolymer. In this case, a reaction time after reaching the attained temperature can be set at about 5 hours.

Flow-starting temperatures of the obtained liquid crystalline polyester can be measured in the several preliminary experiments, and it is confirmed whether the flow initiation temperature is within the desired range (for example, from 280 to 320° C.) or not. The finally reached temperatures in the experiment in which the desired flow initiation temperature is obtained are employed. When the obtained flow initiation temperatures are below the range, preliminary experiments are performed again raising the finally reached temperatures. On the other hand, when the flow initiation temperatures are above the range, preliminary experiments are performed again lowering the finally reached temperatures. By performing the preliminary experiments in such a manner, preferable solid phase polymerization conditions can be set for obtaining a liquid crystalline polyester having a flow initiation temperature of 280 to 320° C.

The liquid crystalline polyester of this embodiment, which has the above-mentioned structure and is obtained as described above, has a flow initiation temperature of 280 to 320° C., preferably from 302 to 318° C. The flow initiation temperature means a temperature at which a melt viscosity is 4800 Pa·s (48000 poises) when a liquid crystalline polyester is extruded from a nozzle using a capillary rheometer equipped with a die having a inside diameter of 1 mm and a length of 10 mm under a load of 9.8 MPa (100 kg/cm$^2$) at a rate of temperature rise of 4° C./minute. The flow initiation temperature can be measured by using, for example, a flow characteristic evaluating device, "Flow Tester CFT-500D" manufactured by Shimadzu Corp. This flow initiation temperature is a indicator for a molecular weight of a liquid crystalline polyester (See, "liquid Crystallinity Polymer Synthesis, Formation and Application" pp 95 to 105, edited by Naoyuki Koide, CMC, Jun. 5, 1987).

The liquid crystalline polyester used for measuring the flow initiation temperature may be in the state of a powder or pellets. The pelletization can be performed by any known methods. For example, the following method can be applied in pelletization. Namely, using a uniaxial or multi-axial extruder, preferably a biaxial extruder, a Banbury mixer or a roller mixer, a liquid crystalline polyester may be molten to be pelletized. On the basis of the flow initiation temperature (Tp (° C.)) of the polyester, the melting and pelletizing steps may be conducted in the temperature range of from lower by 10° C. (included) (i.e., Tp−10 (° C.)) to higher by 100° C. (included) (Tp+100 (° C.)) than the flow initiation temperature of the polyester. As the flow initiation temperature herein, temperatures previously measured in another method or described documents may be utilized.

In order to sufficiently prevent heat degradation of the liquid crystalline polyester, it is more preferable to melt the liquid crystalline polyester in the temperature range of from Tp−10 (° C.) to Tp+70 (° C.), further more preferably in the range of from Tp−10 (° C.) to Tp+50 (° C.) upon pelletization.

In order to obtain the preferable flow initiation temperature, it is preferable that the liquid crystalline polyester of this embodiment has the structural units (i), (ii) and (iii) and has the preferable blending ratio of 2,6-naphthalenediyl group, and that the polyester is produced by the solid phase polymerization as described above. The molecular weight of the liquid crystalline polyester is adequately controlled by the solid phase polymerization, and therefore, the preferable flow initiation temperatures can be easily obtained.

The preferable liquid crystalline polyesters of this embodiment having the above-mentioned structures and the initiation temperature are described below:

Polyesters including 40 to 75% by mole of structural units (i-a) derived from 2-hydroxy-6-naphthoic acid as the structural units (i), 12.5 to 30% by mole of structural units (ii-a) derived from 2,6-naphthalene dicarboxylic acid and structural units (ii-b) derived from terephthalic acid as the structural units (ii), and 12.5 to 30% by mole of the structural units (iii-a) derived from hydroquinone as the structural units (iii), as well as having the molar ratio of (ii-a)/{(ii-a)+(ii-b)} in the structural units (ii) of 0.5 or more are preferable as the liquid crystalline polyester of this embodiment. The molar ratio (% by mole) of each of structural units is based on 100% by mole of the total of the structural units.

More preferable liquid crystalline polyesters are polyesters including 40 to 60% by mole of the structural units (i-a), 14.5 to 29.5% by mole of the structural units (ii-a) and 15 to 30% by mole of the structural units (ii-a) and (ii-b), and 15 to 30% by mole of the structural units (iii-a), as well as having the molar ratio of (ii-a)/{(ii-a)+(ii-b)} of 0.6 or more.

Further more preferable liquid crystalline polyesters are polyesters including 50 to 60% by mole of the structural units (i-a), 15 to 24.5% by mole of the structural units (ii-a) and 20 to 25% by mole of the structural units (ii-a) and (ii-b), and 20 to 25% by mole of the structural units (iii-a), as well as having the molar ratio of (ii-a)/{(ii-a)+(ii-b)} of 0.6 or more.

Next, fibers produced using the liquid crystalline polyester of this embodiment, and fabrics such as non-woven fabrics using the fiber will be described below.

The fiber of this embodiment is composed of the liquid crystalline polyester described above. Such a fiber can be obtained by fiberizing the liquid crystalline polyester in a known method, for example, by melt-spinning the liquid crystalline polyester.

When the liquid crystalline polyester is made into fibers by melt-spinning, the liquid crystalline polyester may be molten by heating, extruded through a given nozzle, and cooled while drawing to solidify the liquid polyester to obtain a thin liquid crystalline polyester fiber.

When the liquid crystalline polyester drawn by melt-spinning is wound as it is, the liquid crystalline polyester fiber can be obtained; on the other hand, when the liquid crystalline polyester is deposited on a given substrate by moving the nozzle before complete solidification, a fabric (non-woven fabric) made of the liquid crystalline polyester fiber can be obtained.

As the liquid crystalline polyester fiber is made of the above-mentioned liquid crystalline polyester, it has a small dielectric loss and high heat resistance. In addition, since the above-described liquid crystalline polyester has a high heat stability (in other word, has low viscosity even when maintained in a molten state for a long time), it is easy to make it into fiber by melt-spinning. Furthermore, since the above-described liquid crystalline polyester can maintain the low viscosity, thin fiber can also be formed easily.

The liquid crystalline polyester fiber and fabric (non-woven fabric) of this embodiment, therefore, can be easily obtained by fiberization, and the fiber has a small fiber diameter. In addition, the fiber and the fabric maintain the excellent properties of the liquid crystalline polyester, that is, have a low dielectric loss and heat resistance, and therefore are applicable to various uses including electronic parts.

The invention being thus described, it will be apparent that the same may be varied in many ways. Such variations are to be regarded as within the spirit and scope of the invention, and all such modifications as would be apparent to one skilled in the art are intended to be within the scope of the following claims.

EXAMPLES

The present invention is described in more detail by following Examples, which should not be construed as a limitation upon the scope of the present invention.

[Measurement of Melt-Starting Temperature]

In each of the following Examples and Comparative Examples, a melt-starting temperature of a prepolymer and a liquid crystalline polyester was measured as follows. That is, first, a capillary rheometer equipped with a die having an inside diameter of 1 mm and a length of 10 mm was charged with 2 g of a sample of a liquid crystalline polyester, using a flow tester (Type CFT-500 manufactured by Shimadzu Corporation). Next, the liquid crystalline polyester was extruded through a nozzle under a load of 9.8 MPa (100 kg/cm$^2$) at a rate of temperature rise of 4° C./minute, and a temperature at which the melt viscosity reached 4800 Pa·s (48000 poises) was measured, which temperature is flow initiation temperature (° C.).

[Production of Liquid Crystalline Polyester]

Production Example 1

To a reactor equipped with a stirrer, a torque meter, a nitrogen gas inlet tube, a thermometer and a reflux condenser were added 1034.99 g (5.5 mole) of 2-hydroxy-6-naphthoic acid, 272.52 g (2.475 mole, fed an excess of 0.225 mole) of hydroquinone, 378.33 g (1.75 mole) of 2,6-naphthalene dicarboxylic acid, 83.07 g (0.5 mole) of terephthalic acid, 1226.87 g (12.0 mole) of acetic anhydride and 0.17 g of 1-methylimidazole as a catalyst, and the mixture was stirred at room temperature for 15 minutes. The temperature of the mixture was raised while stirring it, and the temperature rise was stopped when the inside temperature of the reactor reached 137° C., which was stirred for further 1 hour at the same temperature.

Next, the temperature of the content in the reactor was raised to 310° C. over 4 hours and 50 minutes, while a by-product acetic acid and unreacted acetic anhydride were distilled away. The reaction mixture was maintained at the same temperature for 3 hours to give a liquid crystalline polyester (prepolymer). This prepolymer was cooled to room temperature, and was pulverized through a pulverizer to give a prepolymer powder having a particle size of 0.1 to 1 mm. The flow initiation temperature of the obtained prepolymer was measured, and it was found to be 270° C.

Then, the temperature of the obtained prepolymer powder was raised from room temperature to 250° C. over 1 hour, followed by from the same temperature to 280° C. over 5 hours, and the temperature was maintained at the same temperature for 5 hours to cause solid phase polymerization. The powder after the solid phase polymerization was cooled to give a liquid crystalline polyester in the sate of a powder.

The blending ratio of a 2,6-naphthalenediyl group of the obtained liquid crystalline polyester was calculated based on the ratios of monomers from which the structural units having 2,6-naphthalenediyl group were derived (2-hydroxy-6-naphthoic acid, and 2,6-naphthalene dicarboxylic acid) in the starting monomers used for producing the liquid crystalline polyester, and it was 72.5% by mole. The blending ratios of 2,6-naphthalenediyl groups were measured in the same manner as above in the following Examples and Comparative Examples. Further, the flow initiation temperature of the liquid crystalline polyester was measured, and it was 302° C.

Production Example 2

First, a prepolymer powder was produced in the same manner as in Production Example 1. Then, the temperature of the obtained prepolymer powder was raised from room temperature to 250° C. over 1 hour, followed by from the same temperature to 293° C. over 7 hours and 10 minutes, and the temperature was maintained at the same temperature for 5 hours to cause solid phase polymerization. The powder after the solid phase polymerization was cooled to give a liquid crystalline polyester in the state of a powder. The blending ratio of a 2,6-naphthalenediyl group of the obtained liquid crystalline polyester was 72.5% by mole, and the flow initiation temperature was 318° C.

Production Example 3

First, a prepolymer powder was produced in the same manner as in Production Example 1. Then, the temperature of the obtained prepolymer powder was raised from room temperature to 250° C. over 1 hour, followed by from the same temperature to 298° C. over 8 hours, and the temperature was maintained at the same temperature for 5 hours to cause solid phase polymerization. The powder after the solid phase polymerization was cooled to give a liquid crystalline polyester in the state of a powder. The blending ratio of a 2,6-naphthalenediyl group of the obtained liquid crystalline polyester was 72.5% by mole, and the flow initiation temperature was 322° C.

Production Example 4

To a reactor equipped with a nitrogen gas inlet tube, a tremometer, and a reflux condenser were added 1129.08 g (6.00 mole) of 2-hydroxy-6-naphthoic acid, 409.66 g (2.00 mole, fed an exceed of 0.200 mole) of 4,4'-dihydroxybiphenyl, 332.26 g (0.200 mole) of terephthalic acid, 1221 g (11.9 mole) of acetic anhydride, and 0.17 g of 1-methylimidazole as a catalyst, and the mixture was stirred at room temperature for 15 minutes. The temperature of the mixture was raised while stirring it, and the temperature rise was stopped when the inside temperature of the reactor reached 137° C., which was stirred for further 1 hour while maintaining the same temperature.

Next, the temperature of the content in the reactor was raised to 310° C. over 3 hours and 30 minutes while a by-product acetic acid and unreacted acetic anhydride were distilled away. The reaction mixture was maintained at the same temperature for 2 hours to give a liquid crystalline polyester (prepolymer). This prepolymer was cooled to room temperature, and was pulverized through a pulverizer to give a prepolymer powder having a particle size of 0.1 to 1 mm. The flow initiation temperature of the obtained prepolymer was measured, and it was found to be 298° C.

Then, the temperature of the obtained prepolymer powder was raised from room temperature to 250° C. over 1 hour, followed by from the same temperature to 310° C. over 10 hours, and the temperature was maintained at the same temperature for 5 hours to cause solid phase polymerization. The powder after the solid phase polymerization was cooled to give a liquid crystalline polyester in the sate of a powder.

The blending ratio of a 2,6-naphthalenediyl group of the obtained liquid crystalline polyester was 60% by mole, and the flow initiation temperature was 354° C.

Production Example 5

To a reactor equipped with a stirrer, a torque meter, a nitrogen gas inlet tube, a thermometer and a reflux condenser were added 794.19 g (5.75 mole) of p-hydroxybenzoic acid, 257.38 g (2.337 mole, fed an excess of 0.212 mole) of hydroquinone, 334.01 g (1.545 mole) of 2,6-naphthalene dicarboxylic acid, 96.36 g (0.58 mole) of terephthalic acid, 1223.93 g (12.0 mole) of acetic anhydride, and 0.15 g of 1-methylimidazole as a catalyst, and the mixture was stirred at room temperature for 15 minutes. The temperature of the mixture was raised while it was stirred, and the temperature rise was stopped when the inside temperature of the reactor reached 137° C., which was stirred for further 1 hour, while maintaining the same temperature.

Next, the temperature of the content in the reactor was raised to 310° C. for 4 hours and 50 minutes while a by-product acetic acid and unreacted acetic anhydride were distilled away. The reaction mixture was maintained at the same temperature for 1 hour to give a liquid crystalline polyester (prepolymer). This prepolymer was cooled to room temperature, and was pulverized through a pulverizer to give a prepolymer powder having a particle size of 0.1 to 1 mm. The flow initiation temperature of the obtained prepolymer was measured, and it was found to be 268° C.

Then, the temperature of the obtained prepolymer powder was raised from room temperature to 250° C. over 1 hour, followed by from the same temperature to 295° C. over 5 hours, and the temperature was maintained at the same temperature for 3 hours to cause solid phase polymerization. The powder after the solid phase polymerization was cooled to give a liquid crystalline polyester in the sate of a powder.

The blending ratio of a 2,6-naphthalenediyl group of the obtained liquid crystalline polyester was 15.45% by mole, and the flow initiation temperature was 314° C.

Production Example 6

In a reactor equipped with a stirrer, a torque meter, a nitrogen gas inlet tube, a tremometer and a reflux condenser 911 g (6.6 mole) of p-hydroxybenzoic acid, 409 g (2.2 mole) of 4,4'-dihydroxybiphenyl, 91 g (0.55 mole) of isophthalic acid, 274 g (1.65 mole) of terephthalic acid, and 1235 g (12.1 mole) of acetic anhydride were mixed, and 0.17 g of 1-methylimidazole was added thereto. After the inside of the reactor was fully substituted by nitrogen gas, the temperature thereof was raised to 1500° C. for 15 minutes under stream of nitrogen gas, and the mixture was refluxed for 1 hour while the temperature was maintained at the same temperature.

Then, 1.7 g of 1-methylimidazole was added, and the temperature was raised to 310° C. over 2 hours and 50 minutes while a by-product acetic acid and unreacted acetic anhydride were distilled away, which was maintained kept at the same temperature for 1 hour to give a liquid crystalline polyester (prepolymer). This prepolymer was cooled to room temperature, and was pulverized through a pulverizer to give a prepolymer powder having a particle size of 0.1 to 1 mm. The flow initiation temperature of the obtained prepolymer was measured, and it was found to be 257° C.

Then, the temperature of the obtained prepolymer powder was raised from room temperature to 250° C. over 1 hour, followed by from the same temperature to 285° C. over 5 hours, and the temperature was maintained at the same temperature for 3 hours to cause solid phase polymerization. The powder after the solid phase polymerization was cooled to give a liquid crystalline polyester in the sate of a powder.

The blending ratio of a 2,6-naphthalenediyl group of the obtained liquid crystalline polyester was 0% by mole, and the flow initiation temperature was 330° C.

Evaluation of Properties of Material for Producing Fiber:

Using the various liquid crystalline polyesters as obtained above, each material for producing fiber of Examples 1 and 2 and Comparative Examples 1 to 5 was prepared. In Examples 1 and 2, the liquid crystalline polyesters obtained in Production Examples 1 and 2 were used as the material for producing fiber; Comparative Examples 1 to 4, the liquid crystalline polyesters obtained in Production Examples 3 to 6 were used as the material for producing fiber; and in Comparative Example 6, the prepolymer generated during the production of the liquid crystalline polyester of Production Example 1 (hereinafter referred to as "prepolymer 1") was used as the material for producing fiber.

These materials for producing fiber were granulated by using a twin screw extruder ("PCM-30" manufactured by Ikegai Tekko Kabushiki Kaisha) at a temperature about 10° C. higher than the flow initiation temperature of the liquid crystalline polyester, which composed the material for producing fiber, to give pellets.

Next, after the obtained pellets were dried at 120° C. for 3 hours, they were molded into test specimens having a length of 64 mm, a width of 64 mm and a thickness of 1 mm by using an injection molder (Type PS 40 E 5 ASE manufactured by Nisshin Jushi Kogyo Kabushiki Kaisha) at a cylinder temperature of about 20° C. higher than the flow initiation temperature of the liquid crystalline polyester and at a die temperature of 130° C. These test specimens were used as samples for measuring the dielectric dissipation factor and the melt viscosity.

Measurement of Dielectric Dissipation Factor:

Using the pellets obtained from the materials for producing fiber of Examples 1 and 2 and Comparative Examples 1 to 5, the dielectric dissipation factors at 1 GHz (measured temperature: 23° C.) were measured by an impedance analyzer (manufactured by Hewlett Packard Company). The obtained results are shown in Table 1.

Measurement of Melt Viscosity:

Using the pellets obtained from the materials for producing fiber of Examples 1 and 2 and Comparative Examples 1 to 5, change in melt viscosity with time was measured using a control stress rheometer CVO (manufactured by Bohlin Instruments Inc.) under the following conditions. The melt viscosity was measured 1 minute, 10 minutes, 30 minutes and 60 minutes after the pellets began molten, and the change in melt viscosity with time was evaluated. The obtained results are shown in Table 1.

<Measurement Conditions>
Temperature: 360° C.
Atmosphere: 200 ml of nitrogen/minute
Measurement time: 1 hour
Geometry: cone plate 5.4°/25 φ
Measuring frequency: 1 Hz
Pre-Shear: OFF
TargetStrain: 0.01
Mode: Auto Evaluation of Fiber-Drawing Property:

A Capilographe Type 1B (manufactured by Toyo Seiki Seisaku-sho, Ltd.) having a cylinder barrel diameter of 1 mm φ was charged with about 10 g of each sample of pellets obtained from materials for producing fiber of Examples 1 and 2 and Comparative Examples 1 to 5, and the samples was drawn to a fiber at an extrusion rate of piston of 5.0 mm/minute, while the take-up speed was automatically raised by a speed variable winder to spin the samples. According to the following evaluation criteria, the fiber-drawing property was evaluated when the sample was drawn to a fiber. The obtained results are shown in Table 1.

<Evaluation Criteria>
o: The sample could be drawn within a temperature range of not less than the flow initiation temperature and not more than 400° C., and in this measurement range, the sample could be wound in the state of a fiber.

Δ: The sample could be drawn within a temperature range of not less than the flow initiation temperature and not more than 400° C. and in this measurement range the sample could be wound in the state of a fiber, but the fiber were cut 20 time or more.

x: The sample could not be drawn within a temperature range of not less than the flow initiation temperature and not more than 400° C., and in this measurement range, the sample could not be wound up in the state of a fiber.

TABLE 1

| | | | Material for producing fiber | | | | |
|---|---|---|---|---|---|---|---|
| | Example 1 | Example 2 | Comparative Example 1 | Comparative Example 2 | Comparative Example 3 | Comparative Example 4 | Comparative Example 5 |
| Liquid crystalline polyester | Production Example 1 | Production Example 2 | Production Example 3 | Production Example 4 | Production Example 5 | Production Example 6 | prepolymer 1 |
| Blending ratio of 2,6-naphthalenediyl group | 72.5 | 72.5 | 72.5 | 60 | 15.4 | 0 | 72.5 |
| Flow initiation temperature (° C.) | 302 | 318 | 322 | 354 | 314 | 330 | 270 |
| Dielectric dissipation factor | 0.001 | 0.001 | 0.001 | 0.001 | 0.003 | 0.003 | 0.001 |
| Melt viscosity    1 minute | 11 | 106 | 280 | 11600 | 283 | 120 | impossible to measure |
| 10 minutes | 25 | 136 | 591 | 20300 | 541 | 1860 | impossible to measure |
| 30 minutes | 1420 | 1580 | 7840 | 31100 | 5500 | 17100 | impossible to measure |
| 60 minutes | 9100 | 7750 | 24500 | 44000 | 23000 | 40600 | impossible to measure |
| Fiber-drawing property | ○ | ○ | ○ | Δ | ○ | ○ | x |

Table 1 shows that the material for producing fiber of Examples 1 and 2, obtained from the liquid crystalline polyesters Production Examples 1 and 2, wherein the blending ratio of 2,6-naphthalenediyl group and the flow initiation temperature were within the range of the present invention had low dielectric dissipation factors. Also, it was confirmed that the melt viscosities were less than 10000 even 60 minutes after the materials began molten, and it was possible to satisfactory fiberize them. In addition, it was found that the fiber-drawing properties were good.

On the contrary, it was found that the liquid crystalline polyesters of Comparative Examples 1 to 4, obtained from the liquid crystalline polyesters of Production Examples 3 to 6 wherein the blending ratio of 2,6-naphthalenediyl group or the flow initiation temperature were outside the range of the present invention had melt viscosities of remarkably more than 10000 in elapse of time for 60 minutes after the materials began molten, and the fiberization was difficult in that state. The fiber-drawing property of the liquid crystalline polyester in Comparative Example 2 was inferior to those of polyesters in Examples. With respect to the material for producing fiber of Comparative Example 5 using the prepolymer 1, because the heat stability was low and the melt viscosity was not stable, it was impossible to measure its melt viscosity, and the fiber was often cut while spinning and the fiber could not be obtained.

What is claimed is:

1. A liquid-crystalline polyester having a structural unit represented by the following formula (i), a structural unit represented by the following formula (ii) and a structural unit represented by the following formula (iii):

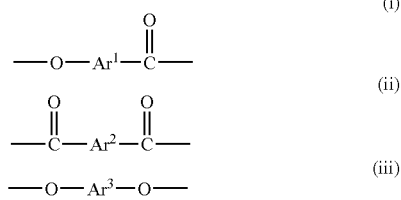

wherein $Ar^1$ is, at each occurrence, a member selected from the group consisting of a 2,6-naphthalenediyl group, a 1,4-phenylene group and a 4,4'-biphenylene group; and $Ar^2$ and $Ar^3$ are each independently, at each occurrence, a member selected from the group consisting of a 2,6-naphthalenediyl group, a 1,4-phenylene group, a 1,3-phenylene group and a 4,4'-biphenylene group, provided that one or more hydrogen atoms on the aromatic ring of each of $Ar^1$, $Ar^2$ and $Ar^3$ may be substituted by a halogen atom, an alkyl group having 1 to 10 carbon atoms, or an aryl group having 6 to 20 carbon atoms; wherein 40% by mole or more of all the groups $Ar^1$, $Ar^2$ and $Ar^3$ are 2,6-naphthalenediyl groups; and wherein the polyester has a flow initiation temperature of from about 280 to about 320° C.

2. The polyester according to claim 1, wherein the polyester has a flow initiation temperature of from about 302 to about 318° C.

3. A fiber comprising the polyester according to claim 1.

4. A non-woven fabric comprising the fiber according to claim 3.

* * * * *